United States Patent [19]

Saito

[11] Patent Number: 5,759,899
[45] Date of Patent: Jun. 2, 1998

[54] METHOD OF FABRICATING SEMICONDUCTOR DEVICE HAVING A SALICIDE STRUCTURE

[75] Inventor: Shuichi Saito, Tokyo, Japan

[73] Assignee: NEC Corporation, Japan

[21] Appl. No.: 592,992

[22] Filed: Jan. 29, 1996

[30] Foreign Application Priority Data

Jan. 30, 1995 [JP] Japan .................... 7-013138

[51] Int. Cl.⁶ .................... H01L 21/336
[52] U.S. Cl. .................... 438/303; 438/486; 438/586; 438/655; 438/683
[58] Field of Search .................... 438/299, 300, 438/649, 655, 657, 683, 413, 482, 487, 488, 489, 230, 233, 303, 586, 486, 592

[56] References Cited

U.S. PATENT DOCUMENTS

| | | | |
|---|---|---|---|
| 5,079,180 | 1/1992 | Rodder et al. | 438/300 |
| 5,346,860 | 9/1994 | Wei | 438/649 |
| 5,387,535 | 2/1995 | Wilmemeyer | 438/649 |
| 5,409,853 | 4/1995 | Yu | 438/300 |
| 5,443,996 | 8/1995 | Lee et al. | 438/649 |

FOREIGN PATENT DOCUMENTS

| | | |
|---|---|---|
| 2-1120 | 1/1990 | Japan . |
| 2-222153 | 9/1990 | Japan . |

OTHER PUBLICATIONS

"Raised Source/Drain MOSFET with Dual Sidewall Spacers" Mark Rodder; IEEE Electron Device Letters, vol. 12, No. 3; Mar. 1991 pp. 89–91.

Lau, S., "Solid Phase Epitaxy in Silicide–Forming Systems", Thin Solid Films, vol. 47, 1977, pp. 313–322, Sep. 1977.

Lou, Y., et al., "The Process Window of a–Si/Ti Bilayer Metallization . . . ", IEEE Transactions on Electron Devices, vol. 39, No. 8, Aug. 1992, pp. 1835–1843, Aug. 1992.

Primary Examiner—T. N. Quach
Attorney, Agent, or Firm—Hayes, Soloway, Hennessey, Grossman & Hage, P.C.

[57] ABSTRACT

The invention provides a method of fabricating a semiconductor device, including the steps of (a) depositing a titanium film over a silicon substrate, (b) depositing an amorphous silicon film on the titanium film, (c) carrying out first thermal annealing to form a first $TiSi_2$ film over a resultant, (d) carrying out second thermal annealing to cause a single crystal silicon layer to grow in a region in which a source/drain region is to be formed, (e) successively removing the amorphous silicon film and the first $TiSi_2$ film, and (f) forming a highly concentrated diffusion layer in the region, the diffusion layer having conductivity opposite to that of the silicon substrate. In accordance with the method, it is possible to form a salicided MOS transistor which includes a source/drain diffusion layer having shallow junction depth, and low-resistive source/drain regions.

10 Claims, 6 Drawing Sheets

FIG. IA
PRIOR ART
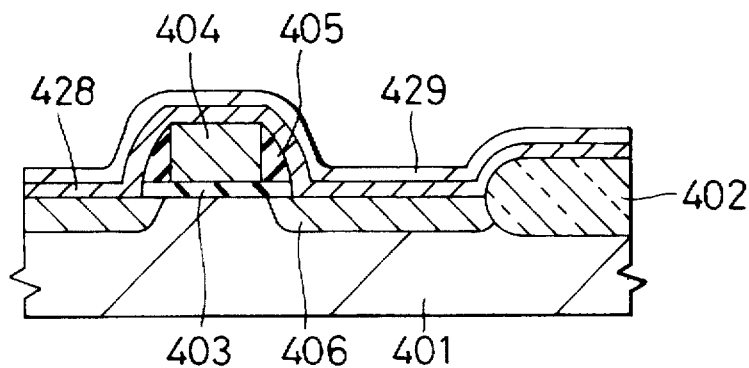
FIG. IB
PRIOR ART
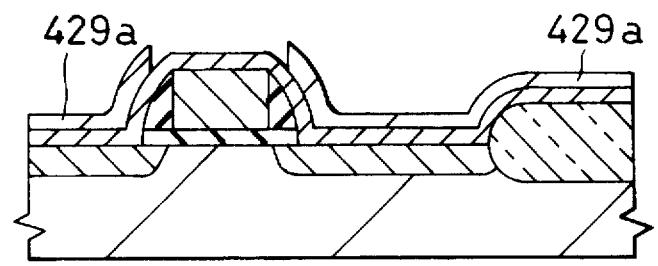
FIG. IC
PRIOR ART
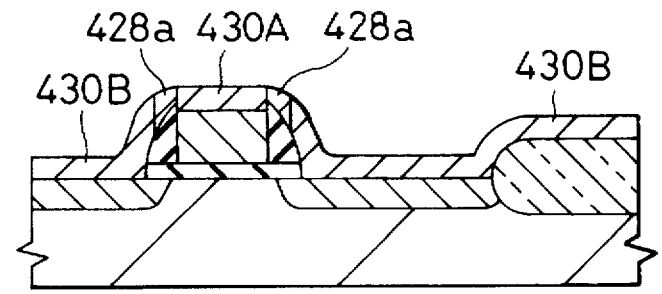
FIG. ID
PRIOR ART
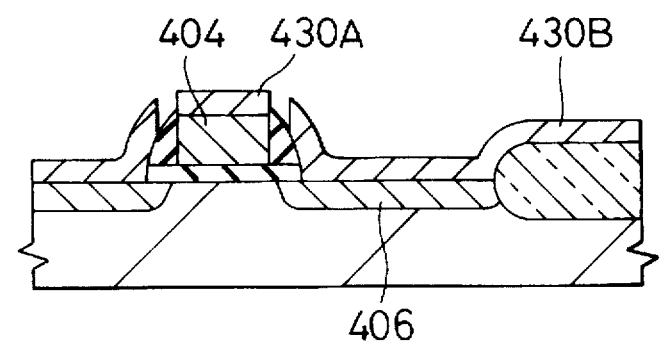

METHOD OF FABRICATING SEMICONDUCTOR DEVICE HAVING A SALICIDE STRUCTURE

BACKGROUND OF THE INVENTION

1. Field of the Invention

The invention relates to a method of fabricating a semiconductor device, and more particularly to a method of fabricating a MOS transistor having a salicide structure by using titanium.

2. Description of the Related Art

As a semiconductor device is more and more reduced in size, it is required for a source/drain diffusion layer, which constitutes a part of a source/drain region of a MOS transistor, to have shallower junction depth. In addition, it is further required for a source/drain region to have a lower resistance, as well as to have a source/drain diffusion layer having a shallow junction depth.

One of methods for satisfying such requirements is a method comprising the steps of forming a diffusion layer having shallow junction depth, and forming titan silicide (TiSi$_2$) on a surface of the diffusion layer. Such a method has been proposed, for instance, in Japanese Unexamined Patent Publication No. 2-1120.

With reference to FIGS. 1A to 1D which are cross-sectional views showing fabrication steps of a semiconductor, hereinbelow is explained the method disclosed in Japanese Unexamined Patent Publication No. 2-1120.

With reference to Fig. 1A, field oxide films 402 are formed on a silicon substrate 401 in device isolation regions. Then, a gate oxide film 403 is formed in a region in which a device is to be formed, and subsequently a polysilicon gate electrode 404 is formed on the gate oxide film 403. A silicon dioxide film is deposited all over a resultant, and then the silicon dioxide film is etched-back to form a sidewall spacer 405 along a sidewall of the polysilicon gate electrode 404. The sidewall spacer 405 is composed of the silicon dioxide film.

Then, highly concentrated impurities are ion-implanted into a region in which a source/drain region is to be formed, to thereby form a source/drain diffusion layer 406 having junction depth of 0.1 μm. Subsequently, a titanium 5 film 428 having a thickness of 100 nm and an amorphous silicon film 429 having a thickness of 200 nm are successively deposited on a resultant. FIG. 1A shows the state after the films 428 and 429 have been deposited.

Then, the amorphous silicon film 429 is patterned by conventional photolithography so that a portion of the amorphous silicon film 429 disposed on 10 the polysilicon gate electrode 404 is removed. By the patterning, portions 429a of the amorphous silicon film 429 is left not removed. Ends of the portions 429a of the amorphous silicon film are disposed above the sidewall spacer 405, as illustrated in FIG. 1B.

Subsequently, rapid thermal annealing (RTA) is carried out at 600 15 degrees centigrade to cause silicidation process, which makes the polysilicon gate electrode 404 react with the titanium film 428 to thereby form a TiSi$_2$ film 430A covering an upper surface of the polysilicon gate electrode 404. The reaction of the amorphous silicon film 429 with the titanium film 428 also forms a TiSi$_2$ film 430B covering the source/drain diffusion layer 406 and field oxide films 402. 20 Portion 428a of the titanium film 428 remain unreacted on the sidewall spacer 405, sandwiched between the TiSi$_2$ films 430A and 430B, as illustrated in Fig. 1C.

Then, only the unreacted titanium films 428a are selectively removed by etching to thereby form a semiconductor device, as illustrated in Fig. 1D.

According to the No. 2-1120, the titanium film 428 does not react with 25 the source/drain diffusion layer 406 in the above mentioned silicidation process due to the amorphous silicon film 429a present on the source/drain diffusion layer 406. Thus, the source/drain diffusion layer 406 is able to have shallow junction depth, and the source/drain region is able to have a lower resistance due to the TiSi$_2$ film 430 B disposed in direct contact with a surface of the source/drain diffusion layer 406.

Another methods of fabricating a MOS transistor including a source/drain diffusion layer having shallower junction depth, which layer constitutes a part of a source/drain region, and a source/drain region having a lower resistance, have been suggested in Japanese Unexamined Patent Publication No. 2-222153 and Mark Rodder et al., "Raised Source/Drain MOSFET with Dual Sidewall Spacers", IEEE Electron Device Letters, Vol. 12, No. 3, pp 89–91, March 1991. These methods comprise the steps of making a thin single crystal silicon layer epitaxial-grow on a silicon substrate in a region in which a source/drain diffusion layer is to be formed, forming a source/drain diffusion layer having equivalently deep junction depth, and silicidizing a surface of the source/drain diffusion layer.

With reference to FIGS. 2A to 2E which are cross-sectional views showing fabrication steps of a semiconductor device, hereinbelow is explained in detail the method of fabricating a semiconductor device having been proposed in Japanese Unexamined Patent Publication No. 2-222153.

First, with reference to FIG. 2A, field oxide films 502 are formed in device isolation regions on a p-type silicon substrate 501. Then, a gate oxide film 503 having a thickness ranging from 5 to 90 nanometers is formed in a region in which a device is to be formed, and subsequently a polysilicon gate electrode 504 is deposited on the gate oxide film 503. The polysilicon gate electrode 504 is covered at an upper surface thereof with a silicon dioxide film 513 having a thickness in the range from 50 to 100 nanometers.

Then, ion-implanting is carried out using the field oxide films 502 and the polysilicon gate electrode 504 as a mask to thereby form a N– diffusion layer 526 including impurities at the concentration ranging from $5 \times 10^{17}$ to $1 \times 10^{20}$ cm$^{-3}$. Then, a silicon dioxide film having a thickness ranging from 20 to 90 nanometers is deposited all over a resultant. The gate oxide film 503 and the silicon dioxide film are etched back to thereby form a first sidewall spacer 505 along a sidewall of the polysilicon gate electrode 504. The etching also forms a natural oxidation film 516 over a surface of the N– diffusion layer 526. FIG. 2A illustrates this stage.

Then, as illustrated in FIG. 2B, the natural oxidation film 516 is removed. Then, as illustrated in FIG. 2C, a single crystal silicon layer 536 having a thickness ranging from 100 to 200 nanometers is made to epitaxially grow on a surface of the N– diffusion layer 526. The single crystal silicon layer 536 has facets.

Then, a silicon dioxide film having a thickness in the range from 100 to 200 nanometers is deposited over a resultant. The thus deposited silicon dioxide film together with the silicon dioxide film 513 are etched back to thereby form a second sidewall spacer 515 covering the sides of the first sidewall spacer 505, and further thereby expose an upper surface of the polysilicon gate electrode. Subsequently, an N+ diffusion layer 546 is formed, for instance, by ion-implanting using the field oxide films 502 and the sidewall spacers 505 and 515 as a mask.

As illustrated in FIG. 2D, the thus formed N+ diffusion layer 546 passes through the N− diffusion layer 526. Herein, the reason why the second sidewall spacer 515 is formed is to avoid the junction depth of the N+ diffusion layer 546 just beneath the facets of the single crystal silicon layer 536 from being locally deep on ion-implanting for the formation of the N+ diffusion layer 546.

Then, a titanium film is deposited all over a resultant. Then, rapid thermal annealing (RTA) is carried out in nitrogen atmosphere to thereby selectively deposit $TiSi_2$ films 554 and 556 on surfaces of the polysilicon gate electrode 504 and the N+ diffusion layer 546, respectively.

Subsequently, unreacted portions of the titanium film and the titanium nitride film are selectively removed to thereby complete an N channel MOS transistor having salicide structure. FIG. 2E illustrates the thus fabricated MOS transistor. A source/drain region 506 of this transistor is composed of the N− diffusion layer 526, the N+ diffusion layer 546 and the $TiSi_2$ film 556.

Though the N− diffusion layer 526 has the equivalently deep junction depth, the effective junction depth is shallower when measured on the basis of a surface of the original p-type silicon substrate 501. Thus, the method proposed in No. 2-222153 makes it possible to make junction depth of a source/drain diffusion layer shallower and lower the resistivity of a source/drain region due to the above mentioned effectively shallower junction depth and the presence of the $TiSi_2$ film 556.

In the firstly mentioned conventional method, the source/drain diffusion layer 406 has shallow junction depth, and thus it is necessary to arrange a thickness of the titanium film 428 to be thin accordingly. Thus, this method has a difficulty of forming a diffusion layer having shallow junction depth. In addition, it is also difficult to lower the resistivity of a source/drain region due to a thin thickness of the $TiSi_2$ film which is caused due to a thin thickness of the titanium film. In further addition, in order to carry out photolithography so that the amorphous silicon film 429a has to be left unremoved, the sidewall spacer 405 is required to have a width greater than an alignment margin to be used in the photolithography steps. In order to avoid offset of the source/drain diffusion layer 406 and the polysilicon gate electrode 404 under such requirement, it is not allowed to arrange the junction depth of the source/drain diffusion layer 406 to be so shallow. Furthermore, the $TiSi_2$ film 430B, which is in direct contact with a surface of the source/drain diffusion layer 406, is not formed in self-alignment to the source/drain diffusion layer 406, and hence it is necessary to carry out patterning of the $TiSi_2$ film 430B again. In conclusion, it is quite difficult to apply This method to the fabrication of a remarkably small-sized semiconductor device.

On the other hand, the secondly mentioned conventional method needs the removal of the natural oxidation film 516 and the selective epitaxial growth of the single crystal silicon layer 536 by CVD, and thus the decrease in fabrication yield is unavoidable. In addition, this method needs the formation of he second sidewall spacer 515 together with the N− diffusion layer 526 in order to overcome a problem caused due to the facets of the single crystal silicon layer 536, and accordingly a margin or gap between the N+ diffusion layer 546 and the polysilicon gate electrode 504 has to be present. Thus, it is also difficult to apply this method to the fabrication of a remarkably small-sized semiconductor device.

SUMMARY OF THE INVENTION

In view of the problems of the prior methods as mentioned above, it is an object of the present invention to provide a method of fabricating a salicide-structured MOS transistor including a source/drain diffusion layer having effectively shallow junction depth, and a source/drain region having low resistivity, which method can be applied to fabrication of a remarkably small-sized semiconductor device without deterioration of fabrication yield.

The invention provides a method of fabricating a semiconductor device, including the steps of (a) depositing a titanium film over a silicon substrate, (b) depositing an amorphous silicon film on the titanium film, (c) carrying out first thermal annealing to form a first $TiSi_2$ film over a resultant, (d) carrying out second thermal annealing to cause a single crystal silicon layer to grow in a region in which a source/drain region is to be formed, (e) successively removing the amorphous silicon film and the first $TiSi_2$ film, and (f) forming a highly concentrated diffusion layer in the region, the diffusion layer having conductivity opposite to that of the silicon substrate.

The present invention further provides a method of fabricating a semiconductor device, including the steps of (a) forming a polysilicon film pattern on a silicon substrate in a region A in which a gate electrode is to be formed, (b) forming a sidewall spacer along sidewalls of the polysilicon film pattern, the sidewall spacer being composed of insulative material, (c) depositing a first titanium film over a resultant, (d) depositing an amorphous silicon film on the first titanium film, (e) carrying out first thermal annealing to form a first $TiSi_2$ film over a resultant, (f) carrying out second thermal annealing to cause a single crystal silicon layer to grow in solid phase in direct contact with a surface of a region B in which a source/drain region is to be formed, and also cause a polysilicon layer to grow in solid phase in direct contact with an exposed surface of the polysilicon film pattern, (g) successively removing the amorphous silicon film and the first $TiSi_2$ film, (h) ion-implanting highly concentrated impurities into the region B, the impurities having conductivity opposite to that of the silicon substrate, (i) depositing a second titanium film over a resultant, (j) carrying out third thermal annealing to selectively form second $TiSi_2$ films on surfaces of the single crystal silicon layer and the polysilicon layer, the second $TiSi_2$ films having C49 structure, and (k) carrying out fourth thermal annealing to shift the second $TiSi_2$ films in phase from C49 to C54.

A temperature at which the second thermal annealing is to be carried out is preferably higher than a temperature at which the first thermal annealing is to be carried out. In addition, a temperature at which the third thermal annealing is to be carried out is preferably higher than a temperature at which the second thermal annealing is to be carried out, and a temperature at which the fourth thermal annealing is to be carried out is preferably higher than a temperature at which the third thermal annealing is to be carried out. The second thermal annealing is carried out preferably at a temperature range in which an amorphous silicon film is not changed into a polysilicon film.

For instance, temperatures at which the first, second, third and fourth thermal annealings are to be carried out is 400–500 degrees centigrade, 500–600 degrees centigrade, 650 degrees centigrade and 850 degrees centigrade, respectively.

The secondly mentioned method preferably further includes the step (l) of forming a refractory metal film between the first titanium film and the amorphous silicon film. The step (l) is to be carried out between the steps (c) and (d). The refractory metal film is selected from, for instance, Co, W or Ni.

The present invention still further provides a method of fabricating a semiconductor device, including the steps of (a) forming field oxides on a silicon substrate in device isolation regions, (b) forming a gate oxide film on the silicon substrate in a region A in which a device is to be formed, (c) forming a polysilicon film pattern on the silicon substrate in a region B in which a gate electrode is to be formed, (d) depositing an insulative film over a resultant, (e) anisotropically etching the insulative film and the gate oxide film to form a sidewall spacer along sidewalls of the polysilicon film pattern and remove a portion of the gate oxide film disposed in a region C in which a source/drain region is to be formed, the sidewall spacer being composed of the insulative film, (f) depositing a first titanium film over a resultant, (g) depositing an amorphous silicon film on the first titanium film, (h) carrying out first thermal annealing to form a first $TiSi_2$ film over a resultant, (i) carrying out second thermal annealing to cause a single crystal silicon layer to grow in solid phase in direct contact with a surface of the region C, and also cause a polysilicon layer to grow in solid phase in direct contact with an exposed surface of the polysilicon film pattern, (j) removing the amorphous silicon film and the first $TiSi_2$ film successively, (k) ion-implanting highly concentrated impurities into the region C using the field oxides and the sidewall spacer as a mask, the impurities having conductivity opposite to that of the silicon substrate, (l) depositing a second titanium film over a resultant, (m) carrying out third thermal annealing to selectively form second $TiSi_2$ films on surfaces of the single crystal silicon layer and the polysilicon layer, the second $TiSi_2$ films having C49 structure, and (n) carrying out fourth thermal annealing to shift the second $TiSi_2$ films in phase from C49 to C54.

The above mentioned method may further include the step of ion-implanting lowly concentrated impurities into the region C using the field oxides and the polysilicon film pattern as a mask, the impurities having conductivity opposite to that of the silicon substrate.

The present invention yet further provides a method of fabricating a semiconductor device, including the steps of (a) depositing a titanium film over a silicon substrate, (b) carrying out first thermal annealing to form $TiSi_2$ films over the silicon substrate, (c) depositing an amorphous silicon film over a resultant, (d) carrying out second thermal annealing to cause a single crystal silicon layer to grow in a region in which a source/drain region is to be formed, (e) selectively removing the amorphous silicon film, and (f) forming a highly concentrated diffusion layer in the region, the diffusion layer having conductivity opposite to that of the silicon substrate.

The present invention still yet further provides a method of fabricating a semiconductor device, including the steps of (a) forming a polysilicon film pattern on a silicon substrate in a region A in which a gate electrode is to be formed, (b) forming a sidewall spacer along sidewalls of the polysilicon film pattern, the sidewall spacer being composed of insulative material, (c) depositing a titanium film over a resultant, (d) carrying out first thermal annealing to selectively form $TiSi_2$ films on surfaces of a region B and the polysilicon film pattern, the $TiSi_2$ films having C49 structure, a source/drain region being to be formed in said region B, (e) depositing an amorphous silicon film over a resultant, (f) carrying out second thermal annealing to cause a single crystal silicon layer to grow in solid phase in direct contact with a surface of the region B, and also cause a polysilicon layer to grow in solid phase in direct contact with an exposed surface of the polysilicon film pattern, (g) selectively removing the amorphous silicon film, (h) ion-implanting highly densified impurities into the region B, the impurities having conductivity opposite to that of the silicon substrate, and (i) shifting the $TiSi_2$ films in phase from C49 to C54, the step (i) being to be carried out concurrently with the step (h).

The present invention further provides a method of fabricating a semiconductor device, including the steps of (a) forming field oxides on a silicon substrate in device isolation regions, (b) forming a gate oxide film on the silicon substrate in a region A in which a device is to be formed, (c) forming a polysilicon film pattern on the silicon substrate in a region B in which a gate electrode is to be formed, (d) depositing an insulative film over a resultant, (e) anisotropically etching the insulative film and the gate oxide film to form a sidewall spacer along sidewalls of the polysilicon film pattern and remove a portion of the gate oxide film disposed in a region C in which a source/drain region is to be formed, the sidewall spacer being composed of the insulative film, (f) depositing a titanium film over a resultant, (g) carrying out first thermal annealing to selectively form $TiSi_2$ films on surfaces of the region C and the polysilicon film pattern, the $TiSi_2$ films having C49 structure, (h) removing unreacted portions of the titanium film, (i) depositing an amorphous silicon film over a resultant, (j) carrying out second thermal annealing to cause a single crystal silicon layer to grow in solid phase in direct contact with a surface of the region C, and also cause a polysilicon layer to grow in solid phase in direct contact with an exposed surface of the polysilicon film pattern, (k) selectively removing the amorphous silicon film, (l) ion-implanting highly concentrated impurities having conductivity opposite to that of the silicon substrate into the region C using the field oxides and the sidewall spacer as a mask, to thereby form a reverse conductivity type highly concentrated diffusion layer, and (m) shifting the $TiSi_2$ films in phase from C49 to C54, the step (m) being to be carried out concurrently with the step (l).

The present invention further provides a method of fabricating a semiconductor device, including the steps of (a) depositing a silicon-rich TiSix film (x>2) over a silicon substrate, (b) carrying out first thermal annealing to cause a single crystal silicon layer to grow in a region in which a source/drain region is to be formed, and also cause the silicon-rich TiSix film to change into a $TiSi_2$ film, (c) selectively removing unreacted portions of the silicon-rich TiSix film, and the $TiSi_2$ film, and (d) forming a highly concentrated diffusion layer in the region, the diffusion layer having conductivity opposite to that of the silicon substrate.

The present invention further provides a method of fabricating a semiconductor device, including the steps of (a) forming a polysilicon film pattern on a silicon substrate in a region A in which a gate electrode is to be formed, (b) forming a sidewall spacer along sidewalls of the polysilicon film pattern, the sidewall spacer being composed of insulative material, (c) depositing a silicon-rich TiSix film (x>2) over a resultant, (d) carrying out first thermal annealing to cause a single crystal silicon layer to grow in solid phase in direct contact with a surface of a region B in which a source/drain region is to be formed, and also cause a polysilicon layer to grow in solid phase in direct contact with an exposed surface of the polysilicon film pattern, and further cause a portion of the silicon-rich TiSix film covering the single crystal silicon layer and polysilicon layer to change into a first $TiSi_2$ film, (e) selectively removing unreacted portions of the silicon-rich TiSix film, and the first TiSi$_2$ film, (f) selectively removing unreacted portions of the silicon-rich TiSix film, and the first TiSi$_2$ film, (g) ion-implanting highly concentrated impurities into the region B, the impurities having conductivity opposite to that of the silicon substrate, (h) depositing a titanium film over a resultant, (i) carrying out second thermal annealing to selectively form second TiSi$_2$ films on surfaces of the single crystal silicon layer and polysilicon layer, the second TiSi$_2$ films having C49 structure, and (j) carrying out third thermal annealing to shift the second TiSi$_2$ films in phase from C49 to C54.

In the above mentioned method, the second thermal annealing is to be carried out is preferably higher than a temperature at which the first thermal annealing is to be carried out, and a temperature at which the third thermal annealing is to be carried out is preferably higher than a temperature at which the second thermal annealing is to be carried out.

For instance, the first, second and third annealings are to be carried out at 500 degrees centigrade, 650 degrees centigrade and 780 degrees centigrade, respectively.

The present invention further provides a method of fabricating a semiconductor device, including the steps of (a) forming field oxides on a silicon substrate in device isolation regions, (b) forming a gate oxide film on the silicon substrate in a region A in which a device is to be formed, (c) forming a polysilicon film pattern on the silicon substrate in a region B in which a gate electrode is to be formed, (d) depositing an insulative film over a resultant, (e) anisotropically etching the insulative film and the gate oxide film to form a sidewall spacer along sidewalls of the polysilicon film pattern and remove a portion of the gate oxide film disposed in a region C in which a source/drain region is to be formed, the sidewall spacer being composed of the insulative film, (f) depositing a silicon-rich TiSix film (x>2) over a resultant, (g) carrying out first thermal annealing to cause a single crystal silicon layer to grow in solid phase in direct contact with a surface of the region C, and also cause a polysilicon layer to grow in solid phase in direct contact with an exposed surface of the polysilicon film pattern, and further cause a portion of the silicon-rich TiSix film covering the single crystal silicon layer and polysilicon layer to change into a first TiSi$_2$ film, (h) selectively removing unreacted portions of the silicon-rich TiSix film, and the first TiSi$_2$ film, (i) ion-implanting highly concentrated impurities into the region C using the field oxides and sidewall spacer as a mask, the impurities having conductivity opposite to that of the silicon substrate, (j) depositing a titanium film over a resultant, (k) carrying out second thermal annealing to selectively form second TiSi$_2$ films on surfaces of the single crystal silicon layer and the polysilicon layer, the second TiSi$_2$ films having C49 structure, (l) removing unreacted portions of the second TiSi$_2$ films, and (m) carrying out third thermal annealing to shift the second TiSi$_2$ films in phase from C49 to C54.

The advantages obtained by the aforementioned present invention will be described hereinbelow.

In the method in accordance with the invention, in a region of a silicon substrate in which a source/drain diffusion layer is to be formed is deposited a single crystal silicon layer by solid-phase epitaxial growth without removal of a natural oxidation film by using a TiSi$_2$ film or a silicon-rich TiSi film as a source. Then, a source/drain diffusion layer is formed having effectively shallow junction depth on a silicon substrate in the region the single crystal silicon layer has been formed.

This single crystal silicon layer does not have facets unlike a single crystal silicon layer formed through selective epitaxial growth by means of CVD. In addition, it is no longer necessary to thicken the sidewall spacer composed of an insulative film than required. Furthermore, though the junction depth of the source/drain diffusion layer is equivalently deep, it is effectively shallow when measured on the basis of a surface of the original silicon substrate.

Thus, the present invention enables to fabricate a salicide-structured, remarkably small-sized MOS transistor including a source/drain diffusion layer having effectively shallow junction depth, and a source/drain region having lower resistivity without deterioration of fabrication yield.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 1A, 1B, 1C and 1D are cross-sectional views showing respective step of a conventional method of fabricating a semiconductor device;

DESCRIPTION OF THE PREFERRED EMBODIMENTS

Preferred embodiments in accordance with the present invention will be explained hereinbelow with reference to drawings.

With reference to FIGS. 3A to 3E and FIGS. 4A to 4C, hereinbelow is explained a method of fabricating an n-type channel MOS transistor in accordance with the first embodiment of the present invention.

Figure 2A:
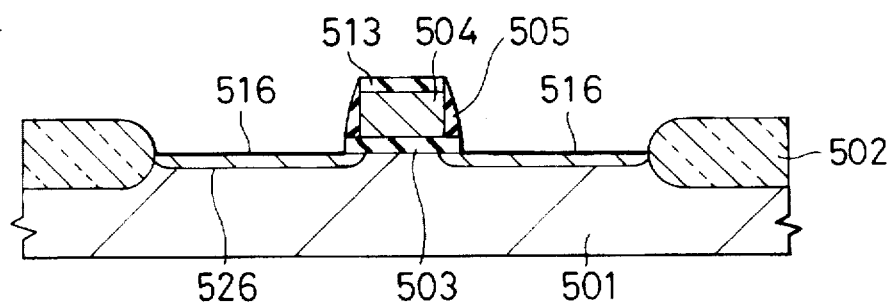
FIGS. 2A, 2B, 2C, 2D and 2E are cross-sectional views showing respective step of another conventional method of fabricating a semiconductor device.
Figure 2B:
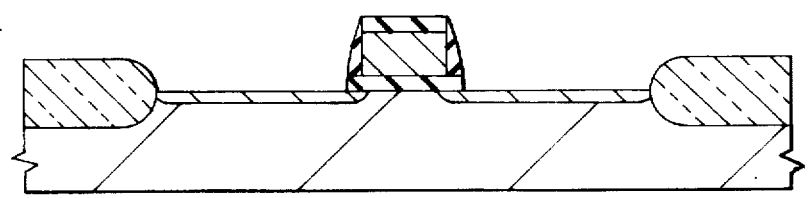
Figure 2C:
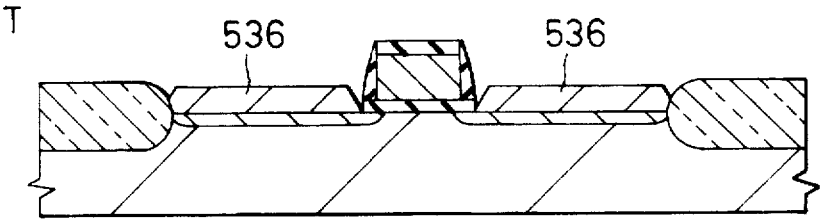
Figure 2D:
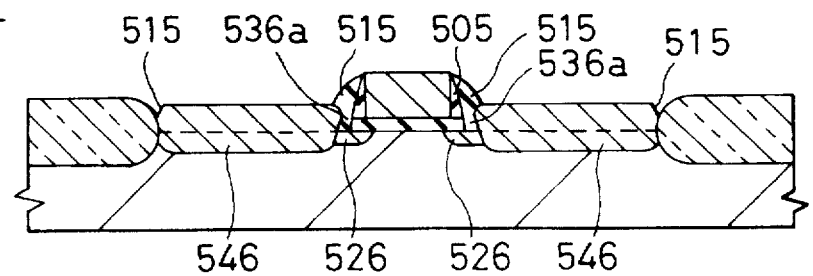
Figure 2E:
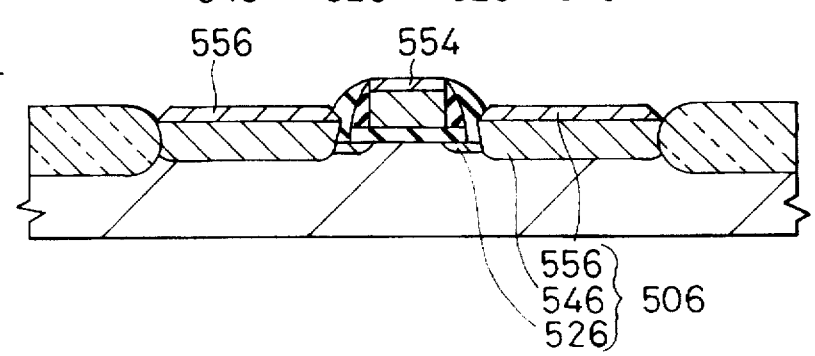
Figure 3A:
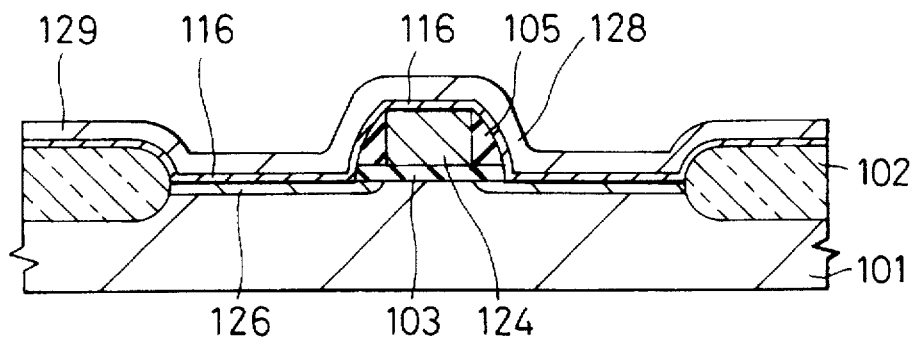
FIGS. 3A, 3B, 3C, 3D and 3E are cross-sectional views showing respective step of a method in accordance with the first embodiment of the present invention.

With reference to FIG. 3A, field oxide films 102 are first formed by selective oxidation in device isolation regions on a surface of a p-type silicon substrate 101, and a gate oxide film 103 is deposited having a thickness of about 5 nanometers by thermal oxidation in a region in which a device is to be formed. Then, an N+ polysilicon film having a thickness of about 200 nanometers is deposited by CVD entirely over a resultant. Subsequently, the N+ polysilicon film is patterned to thereby form an N+ polysilicon film pattern 124 in a region in which a gate electrode is to be formed. The N+ polysilicon film pattern 124 has a width or gate length of about 0.12 μm on the gate oxide film 103.

Then, ion-implanting is carried out at 5 KeV with doses of $3\times10^{14}$ cm$^{-2}$ As using the field oxide films 102 and the polysilicon film pattern 124 as a mask, followed by RTA at 1000° C. for 15 seconds, to thereby form an N− diffusion layer 126 having junction depth of about 40 nanometers. Then, a silicon dioxide film (not illustrated) having a thickness of about 50 nanometers is deposited by CVD over a resultant. The thus deposited silicon dioxide film and the gate oxide film 103 are etched back to form a sidewall spacer 105 along a sidewall of the polysilicon film pattern 124. A resultant is immersed into dilute hydrofluoric acid to thereby clean a surface of the N– diffusion layer 126. At this stage, on a surface of the N– diffusion layer 126 is deposited a natural oxidation film 116 having a thickness of about 1.5 nanometers. It should be noted that the sidewall spacer 105 may be composed of a silicon nitride film as well as a silicon dioxide film.

Figure 4A:
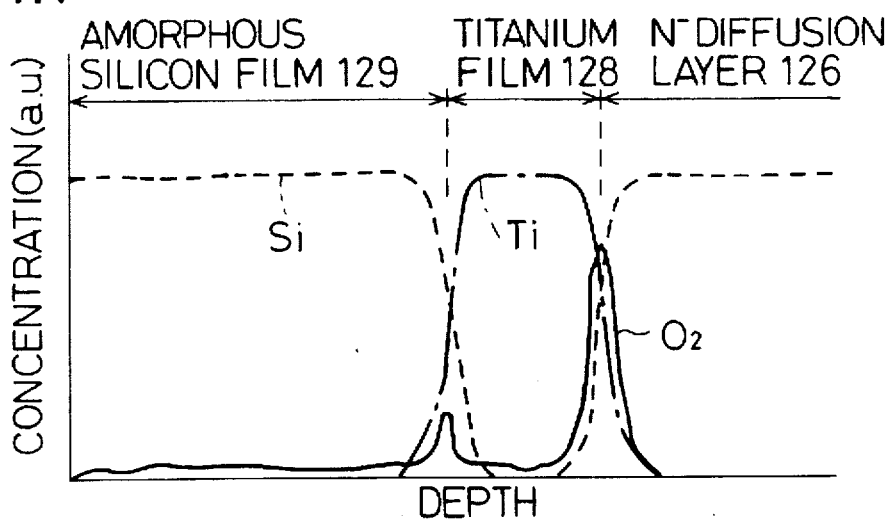
FIGS. 4A, 4B and 4C illustrate concentration profiles of constituent elements of a region in which a source/drain region is to be formed, in depth-wise direction.

Then, sputtering is successively carried out in argon (Ar) gas to thereby deposit a first titanium film 128 having a thickness of about 50 nanometers and an amorphous silicon film 129 having a thickness of about 100 nanometers in this order over a resultant, as illustrated in FIGS. 3A and 4A. In an alternative to sputtering, chemical vapor deposition (CVD) may be employed for the formation of the amorphous silicon film 129.

Figure 3B:
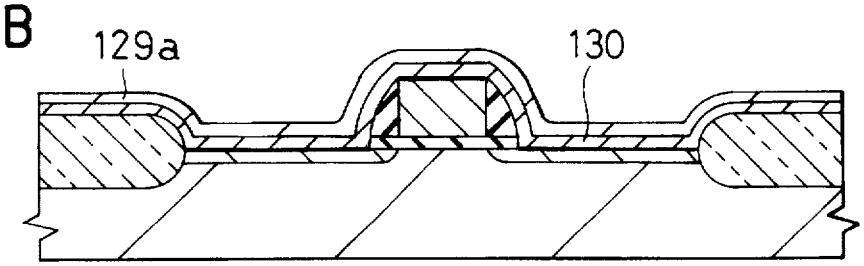
Figure 4B:
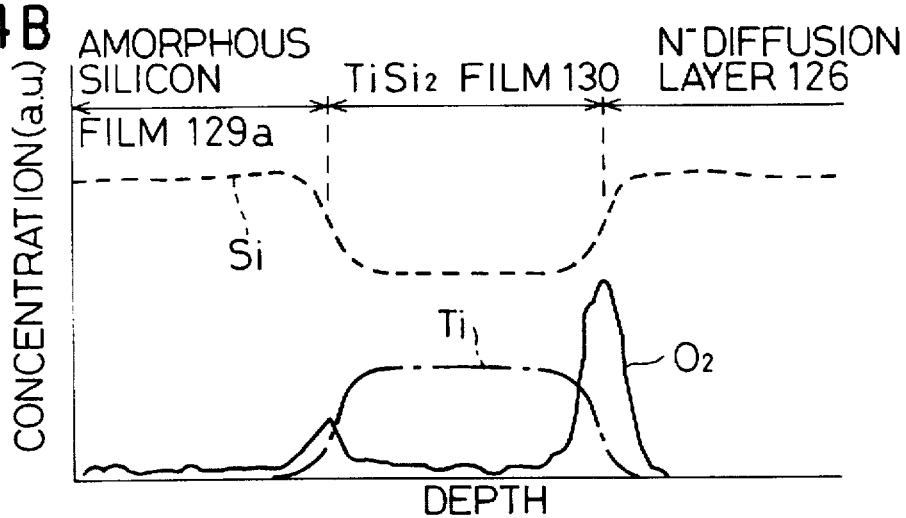

Then, a first thermal annealing is carried out at 400–500° C. for about 30 minutes in nitrogen atmosphere. The first thermal annealing causes silicidation process to occur between the titanium film 128 and the amorphous silicon film 129, resulting in that a $TiSi_2$ film 130 having a thickness of about 90 nanometers is formed over the silicon substrate. To be exact, the film 130 is rather silicon-rich relative to $TiSi_2$. An amorphous silicon film 129a having a thickness of about 75 nanometers remains deposited over the $TiSi_2$ film 130. Even by the first thermal annealing, the natural oxidation film 116 remains as it is. This state is illustrated in FIGS. 3B and 4B. The temperature range 400–500° C. of the first thermal annealing does not cause the titanium film 128 to react with both the N– diffusion layer 126 and silicon constituting the polysilicon film pattern 124 through the natural oxidation film 116, and hence the reaction mentioned above preferentially occurs.

It should be noted that it is not preferable to carry out the first thermal annealing at so high temperature. If the first thermal annealing is to be carried out at temperature range of the later mentioned second thermal annealing, a single crystal silicon layer and the like is formed at the same time of the formation of the $TiSi_2$ film 130, and it is quite difficult to control a total thickness of the $TiSi_2$ film 130 and the thus formed single crystal silicon layer to be a desired one. On the other hand, if the first thermal annealing is to be carried out at the temperature range 400–500° C. under the presence of the natural oxidation film 116, the N– diffusion layer 126 and silicon constituting the polysilicon film pattern 124 do not contribute to the silicidation process, resulting in that the $TiSi_2$ film 130 having a uniform thickness can be obtained.

Then, a second thermal annealing is carried out at 500–600° C. in nitrogen atmosphere for 3 hours. It should be noted that the temperature range of the second thermal annealing is higher than that of the first thermal annealing. The second thermal annealing causes the natural oxidation film 116 to react with titanium constituting the $TiSi_2$ film 130, and thus the natural oxidation film 116 is removed out of an upper surface of the polysilicon film pattern 124 and a surface of the N– diffusion layer 126. This is because oxygen forms weak bond to silicon in the natural oxidation film 116. Such removal of the natural oxidation film 116 would not occur in the field oxide films 102 and the gate oxide film 103 formed by thermal oxidation, and also in the sidewall spacer 105 composed of a silicon dioxide film formed by CVD in all of which oxygen forms strong bond to silicon.

Figure 3C:
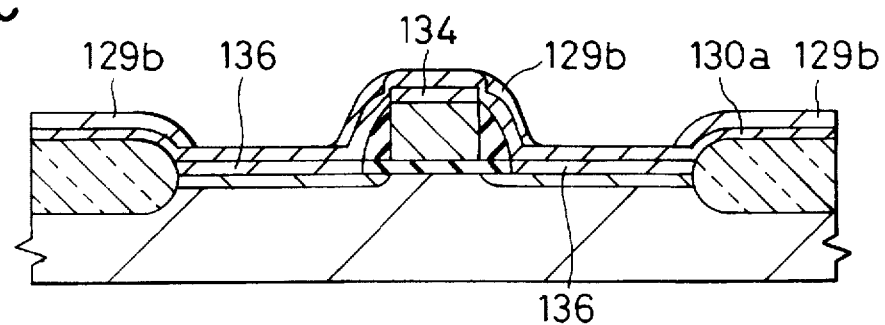
Figure 4C:
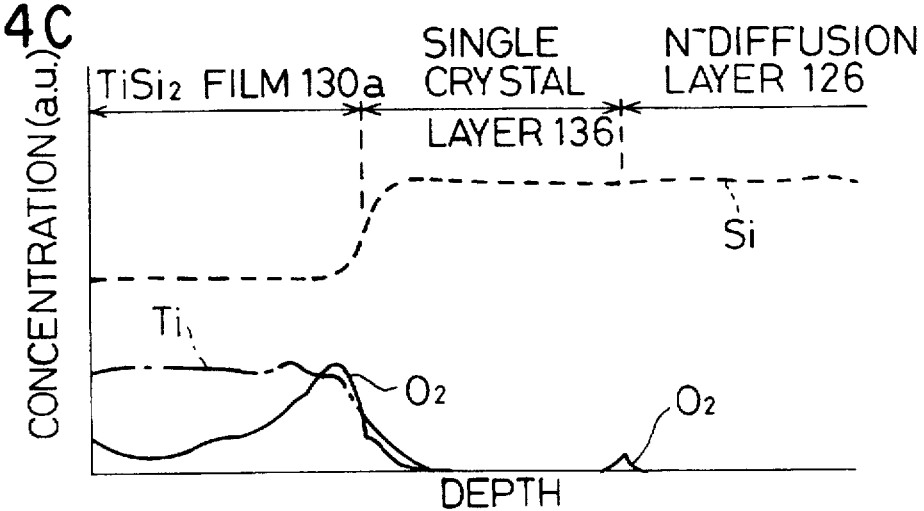

By continuing the second thermal annealing for relatively long time, the total energy of the system is decreased, so that silicons contained in portions of the amorphous silicon film 129a disposed above the polysilicon film pattern 124 and the N– diffusion layer 126 pass through the $TiSi_2$ film 130 and reach the polysilicon film pattern 124 and the N– diffusion layer 126. As a result, a polysilicon layer 134 having a thickness of about 70 nanometers selectively grows in solid phase on a surface of the polysilicon film pattern 124, while a single crystal silicon layer 136 having a thickness of about 70 nanometers selectively, epitaxially grows in solid phase on a surface of the N– diffusion layer 126. The $TiSi_2$ film 130 changes into a $TiSi_2$ film 130a, and an amorphous silicon film 129b remains deposited only above the field oxide films 102 and the sidewall spacer 105 through the $TiSi_2$ film 130a, as illustrated in FIGS. 3C and 4C.

The second thermal annealing is carried out preferably at the temperature range so that an amorphous silicon film is not changed into a polysilicon film. If the second thermal annealing is carried out at a temperature at which an amorphous silicon film is changed into a polysilicon film, it is not easy for silicons to move to a surface of the N– diffusion layer 126 through the $TiSi_2$ film 130a in spite of high temperature. Thus, it is quite difficult to control a thickness, in particular, of the single crystal silicon layer 136.

Figure 3D:
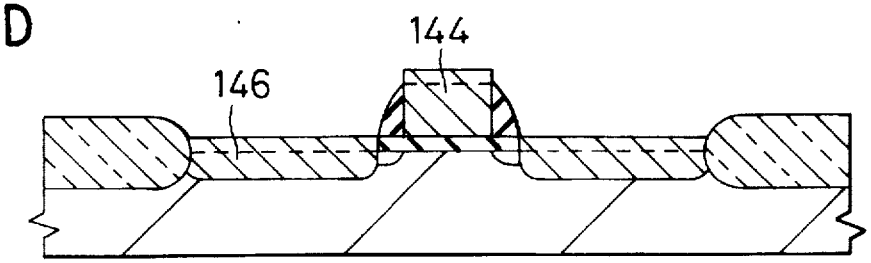

Then, a resultant is immersed in a mixture solution of HF, $HNO_3$, $CH_3COOH$ and $H_2O$ to thereby selectively remove the amorphous silicon film 129b by etching. A resultant is further immersed in a mixture solution of $H_2O_2$ and $HNO_3$ to thereby selectively remove the $TiSi_2$ film 130 by etching. Then, ion-implanting is carried out at 30 KeV with doses of $5 \times 10^{15}$ As $cm^{-2}$ using the field oxide films 102 and the sidewall spacer 105 as a mask, followed by RTA at 1000° C. for 10 seconds and thermal annealing at 700° C. in an electric furnace for one hour. The ion-implanting and subsequent thermal annealings cause the polysilicon layer 134 and the single crystal silicon layer 136 to change into N+ type layers, and thus N+ polysilicon film pattern 144 and N+ diffusion layer 146 are formed. Though the N+ diffusion layer 146 has equivalently deep junction depth, specifically about 130 nanometers, the effective junction depth is shallow, specifically about 60 nanometers, relative to a surface of the original p-type silicon substrate 101, namely a surface of the N– diffusion layer 126. This means that the N+ diffusion layer 146 passes through the N– diffusion layer 126 by about 10 nanometers, as illustrated in FIG. 3D.

A thickness of the amorphous silicon film 129 is dependent on the junction depth of the N+ diffusion layer 146. In other words, a thickness of the amorphous silicon film 129 is determined according to a required thickness of the single crystal silicon layer 136. The determination of a thickness of the amorphous silicon film 129 in turn determines a thickness of the first titanium film 128.

Though the polysilicon layer 134 is formed in N+ type in the present embodiment, it may be formed to be non-doped. This is because since a polysilicon film has a sufficiently greater diffusion coefficient than that of a single crystal silicon if the polysilicon film has a thickness of about 200 nanometers, it is possible to change a non-doped polysilicon film pattern into N+ type by ion-implanting and subsequent thermal annealings for the formation of the N+ diffusion layer 146.

Subsequently, sputtering is carried out to thereby deposit a second titanium film (not illustrated) having a thickness of about 30 nanometers all over a resultant. Then, rapid thermal annealing (RTA) is carried out at 650° C. for 30 seconds as third thermal annealing to thereby selectively form a TiSi$_2$ film (not illustrated) having C49 structure on upper surfaces of both the polysilicon film pattern 144 and the N+ diffusion layer 146.

Figure 3E:
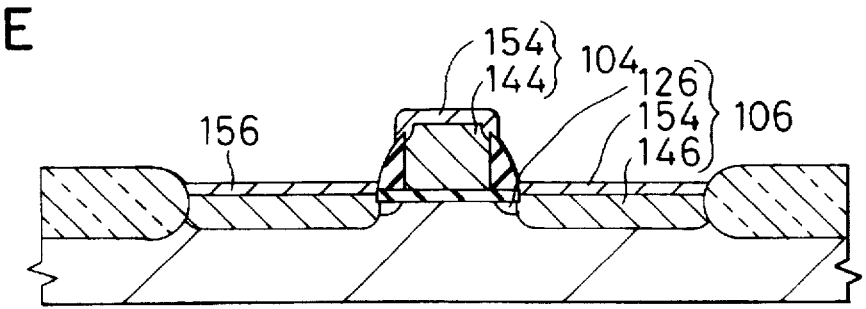

Then, RTA is carried out at 850° C. for 30 seconds as fourth thermal annealing to thereby change in phase the C49 TiSi$_2$ film formed on the polysilicon film pattern 144 and the N+ diffusion layer 146 into C54 TiSi$_2$ films 154 and 156, respectively. As a result, as illustrated in FIG. 3E, there are completed the formation of a gate electrode 104 composed of the N+ polysilicon film pattern 144 and the TiSi$_2$ film 154, and also the formation of a source/drain region 106 composed of the N– diffusion layer 126 and the N+ diffusion layer 146.

The reason why the third thermal annealing, the removal of unreacted portions of the second titanium film and the fourth thermal annealing are carried out for the formation of C54 TiSi$_2$ films 154 and 156 with the second titanium film is to avoid leak current increase and short-circuits between the TiSi$_2$ films 154 and 156 which would occur due to bridging phenomena on a surface of the sidewall spacer 105 to thereby avoid resistivity increase of the TiSi$_2$ film which would occur due to cohesion.

Subsequently, though not illustrated, formation of inter-layer insulative films, formation of contact holes, arrangement of metal wirings and so on are carried out using conventional techniques, thereby an n-channel MOS transistor is completed.

In the above mentioned first embodiment, the single crystal silicon layer 136 is formed through epitaxial growth in solid phase, and does not have facets. Also in the first embodiment, the N+ diffusion layer 146 is to be formed after the single crystal silicon layer 136 has been formed. These two points makes it easy in the first embodiment to form source/drain diffusion layers having effectively shallow junction depth, even if a sidewall spacer has an effectively narrow width, unlike the methods having been proposed in the above mentioned Japanese Unexamined Patent Publications Nos. 2-1120 and 2-222153.

In addition, after the source/drain diffusion layers have been formed, the C54 TiSi$_2$ film is formed on surfaces of those layers in self-alignment fashion. Thus, it is no longer necessary to make a thickness of the TiSi$_2$ film to be significantly thin, and hence it is possible to avoid the resistivity of a source/drain region and a gate electrode from being increased.

Furthermore, the present embodiment makes it no longer necessary to use a low fabrication yield step such as selective epitaxial growth of a single crystal silicon layer by CVD and removal of a natural oxidation film, and also a photolithography step requiring strict alignment margin, thereby a remarkably small-sized, salicide-structured MOS transistor can be easily manufactured.

Though the N– diffusion layer 126 is to be formed in the first embodiment, the first embodiment can be applied to the formation of an n-channel MOS transistor having no N– diffusion layer. In that case, it is necessary to collectively consider a width of the sidewall spacer 105, width of the single crystal silicon layer 136, the titanium film 128 and the amorphous silicon film 129, and junction depth of the N+ diffusion layer 146 in order to avoid the source/drain region 106 from being offset the gate electrode 104.

In the first embodiment, the amorphous silicon film 129 is deposited directly on the titanium film 128. However, a refractory metal film may be interposed between the titanium film 128 and the amorphous silicon film 129. The refractory metal film may be selected from, for instance, a cobalt (Co) film, a tungsten (W) film or a nickel (Ni) film. If metal laminated structure composed of a titanium film and the above mentioned refractory metal film is to be used, it is necessary that an underlying layer is composed of a titanium film in order to cause a uniform silicide film to be deposited by the first thermal annealing and also cause a single crystal silicon layer to epitaxially grow in solid phase by the second thermal annealing.

The first embodiment was applied to an n-channel MOS transistor, but not to be limited to that, and can be applied to a p-channel MOS transistor and a CMOS transistor.

When the first embodiment is to be applied to the formation of a CMOS transistor, the following steps are to be carried out: (a) forming a well on a surface of a silicon substrate having certain conductivity, (b) forming a non-doped polysilicon film pattern having a thickness of, for instance, about 200 nanometers in place of the N+ polysilicon film pattern 124 in a region in which a gate electrode is to be formed, (c) forming a P– diffusion layer just prior to or just after the formation of the N– diffusion layer 126, and (d) subsequently to the formation of the N+ diffusion layer 146, carrying out ion-implanting at 20 KeV with doses of 5 ×10$^{15}$ BF$_2$ cm$^{-2}$, followed by RTA at 1000° C. for 10 seconds and subsequent thermal annealing in an electric furnace for an hour to thereby form a P+ diffusion layer having equivalent junction depth of about 130 nanometers which is the same as that of the N+ diffusion layer 146. The method of fabricating a CMOS transistor has the same steps as those of the first embodiment except the above mentioned steps (a) to (d).

If the above mentioned Japanese Unexamined Patent Publication No. 2-1120 is applied to the formation of a CMOS transistor or a p-channel MOS transistor, a titanium film, an amorphous silicon film and a TiSi$_2$ film are to be formed after formation of a P+ diffusion layer. Since the thermal annealing temperature for carrying out silicidation process is quite high, the silicidation process occurs also on a surface of the P+ diffusion layer, and thus the TiSi$_2$ film formed on the P+ diffusion layer comes to have a greater thickness than that of a TiSi$_2$ film to be formed on an N+ diffusion layer. Considering this fact, it is necessary to arrange the junction depth of the P+ diffusion layer to be further deeper, resulting in much difficulty of small-sizing of a semiconductor device.

On the other hand, in an application of the first embodiment to the fabrication of a CMOS transistor, a single crystal silicon layer is formed by epitaxial growth in solid phase in a region in which a P+ or N+ diffusion layer is to be formed, prior to the formation of the P+ or N+ diffusion layer. Thus, it is possible to avoid the above mentioned problem as occurring in No. 2-1120.

With reference to FIGS. 5A to 5D, hereinbelow is explained a case in which a method in accordance with the second embodiment of the present invention is applied to formation of an n-channel MOS transistor.

Figure 5A:
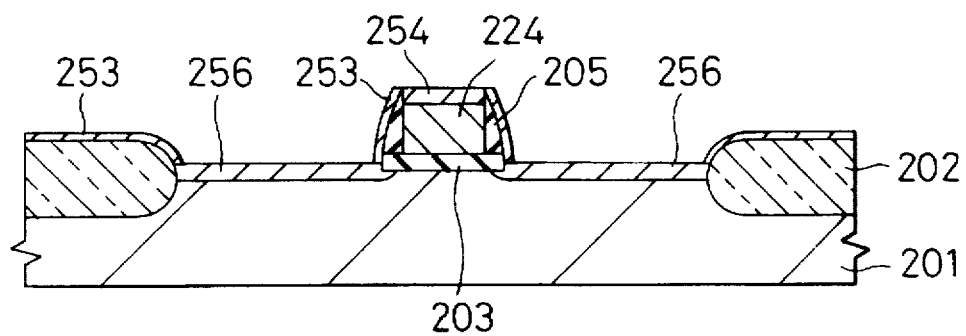
FIGS. 5A, 5B, 5C and 5D are cross-sectional views showing respective step of a method in accordance with the second embodiment of the present invention.

With reference to FIG. 5A, field oxide films 202 are first formed by selective oxidation in device isolation regions on a surface of a p-type silicon substrate 201, and a gate oxide film 203 having a thickness of about 5 nanometers is deposited by thermal oxidation in a region in which a device is to be formed. Then, an N+ or non-doped polysilicon film having a thickness of about 200 nanometers is deposited by CVD entirely over a resultant. Subsequently, the polysilicon film is patterned to thereby form a polysilicon film pattern 224 in a region in which a gate electrode is to be formed. The polysilicon film pattern 224 has a width or gate length of about 0.12 μm on the gate oxide film 203.

Then, a silicon dioxide film (not illustrated) having a thickness of about 20 nanometers is deposited by CVD over a resultant. The thus deposited silicon dioxide film and the gate oxide film 203 are etched back to form a sidewall spacer 205 along a sidewall of the polysilicon film pattern 224. It should be noted that the sidewall spacer 105 may be composed of a silicon nitride film as well as a silicon dioxide film. A resultant is immersed into dilute hydrofluoric acid to thereby clean an exposed surface of the p-type silicon substrate 201.

Then, sputtering is carried out in argon (Ar) gas to thereby deposit a titanium film 253 having a thickness of about 35 nanometers over a resultant. Then, RTA as first thermal annealing is carried out at 650° C. for 30 seconds to thereby selectively form C49 -structured $TiSi_2$ films 254 and 256 each having a thickness of about 60 nanometers on an upper surface of the polysilicon film pattern 224 and a region in which a source/drain diffusion layer is to be formed, respectively, as illustrated in FIG. 5A.

Figure 5B:
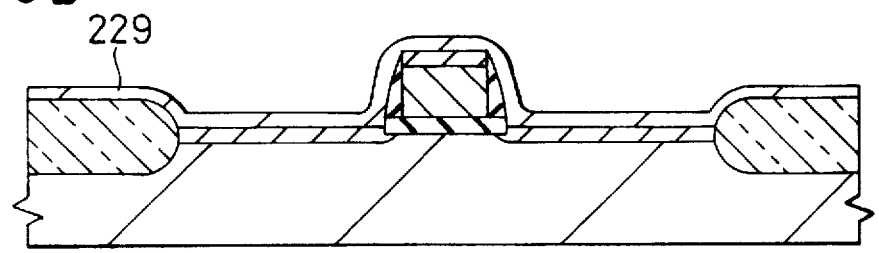

Then, a resultant is immersed in a mixture solution of $H_2O_2$ and $HNO_3$ to thereby selectively remove unreacted portions of the titanium film 253. Subsequently, an amorphous silicon film 229 having a thickness of about 70 nanometers is deposited all over a resultant, as illustrated in FIG. 5B. In the second embodiment, since the amorphous silicon film 229 is formed after the formation of the $TiSi_2$ films 254 and 256 unlike the first embodiment, a thickness of the titanium film 253 can be determined in a broader range than a range in which a thickness of the first titanium film 128 of the first embodiment is to be determined.

Figure 5C:
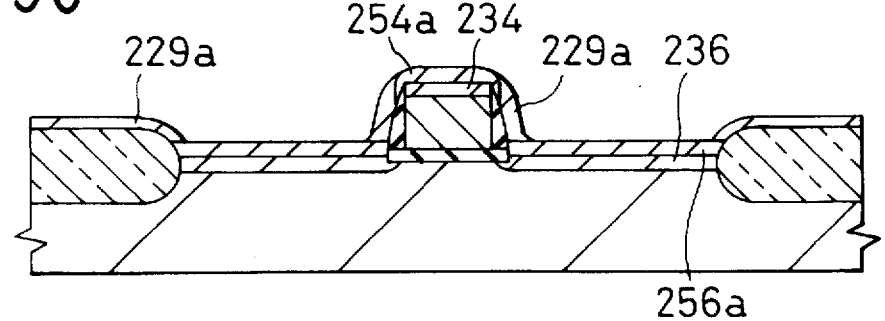

Then, a second thermal annealing is carried out at 500–600° C. in nitrogen atmosphere for 2 hours. It should be noted that the temperature range of the second thermal annealing is lower than the temperature of the first thermal annealing, but the second thermal annealing is continued in longer period of time than that of the first thermal annealing. As a result, a polysilicon layer 234 having a thickness of about 70 nanometers selectively grows in solid phase on an upper surface of the polysilicon film pattern 224, while a single crystal silicon layer 236 having a thickness of about 70 nanometers selectively, epitaxially grows in solid phase on a surface of the p-type silicon substrate 201 in a region in which a source/drain diffusion layer is to be formed. In addition, the $TiSi_2$ film 254 changes into a $TiSi_2$ film 254a covering the polysilicon film 234, whereas the $TiSi_2$ film 256 changes into a $TiSi_2$ film 256a covering the single crystal silicon layer 236. An amorphous silicon film 229a remains deposited only on the field oxide films 202 and the sidewall spacer 205, as illustrated in FIG. 5C. Thicknesses of the polysilicon layer 234 and the single crystal silicon layer 236 are dependent on a thickness of the amorphous silicon film 229 and the conditions of the second thermal annealing.

Then, the amorphous silicon film 229a is selectively removed in the same way as that of the first embodiment. Then, ion-implanting is carried out at 70 KeV with doses of $5 \times 10^{15}$ As $cm_{-2}$ using the field oxide films 202 and the sidewall spacer 205 as a mask, followed by thermal annealing at 750° C. in an electric furnace for 30 minutes. The ion-implanting and subsequent thermal annealing cause N+ polysilicon film pattern 244 and N+ diffusion layer 246 to be formed. At the same time, the C49 -structured $TiSi_2$ films 254a and 256a are shifted in phase into C54 -structured $TiSi_2$ films 254b and 256b. The N+ diffusion layer 246 has equivalently deep junction depth, specifically junction depth of about 120 nanometers.

Figure 5D:
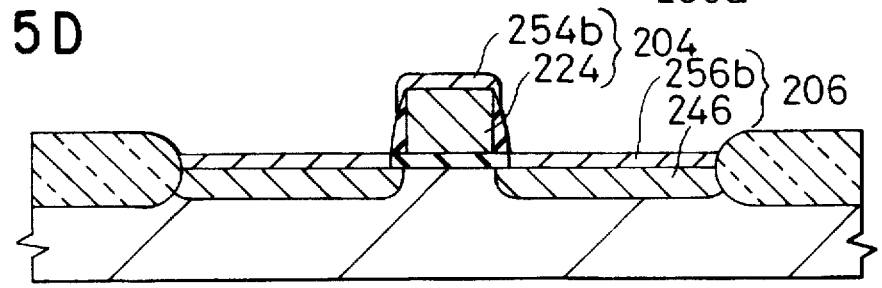

As a result, as illustrated in FIG. 5D, there are completed the formation of a gate electrode 204 composed of the N+ polysilicon film pattern 244 and the $TiSi_2$ film 254, and also the formation of a source/drain region 206 composed of the N+ diffusion layer 246 and the $TiSi_2$ film 256. The conditions as mentioned above of the ion-implanting and thermal annealing for the formation of the N+ diffusion layer 246 are determined in dependence on desired junction depth, a thickness of the $TiSi_2$ film 256b, and a thickness of the single crystal silicon layer 236.

Subsequently, though not illustrated, formation of inter-layer insulative films, formation of contact holes, arrangement of metal wirings and so on are carried out using conventional techniques, thereby an n-channel MOS transistor is completed.

The above mentioned second embodiment has the same advantageous effects as those of the first embodiment. In addition, the method in accordance with the second embodiment does not need to have a step of forming a second titanium film, and hence is simpler than the method in accordance with the first embodiment.

Though an N– diffusion layer is not formed in the second embodiment, it is easy to apply the second embodiment to formation of a MOS transistor having a LDD structured source/drain diffusion layer. In such a case, it is necessary to determine junction depth of an N– diffusion layer taking into consideration a decrement of the titanium film 253 which would be caused when the titanium film 253 is silicidized into the $TiSi_2$ film 256, and also necessary to determine a width of the sidewall spacer 205 to be rather thicker accordingly. The second embodiment may be applied to a method of fabricating a p-channel MOS transistor and a CMOS transistor similarly to the first embodiment.

In a case where the second embodiment is applied to a method of fabricating a CMOS transistor, a P+ diffusion layer is formed, subsequently to formation of the N+ diffusion layer 246, by carrying out ion-implanting at 50 KeV with doses of $5 \times 10^{15}$ $BF_2$ $cm^{-2}$, followed by thermal annealing at 750° C. in an electric furnace for 30 minutes. The thus formed P+ diffusion layer has equivalent junction depth of about 120 nanometers which is the same as that of the N+ diffusion layer 246.

With reference to FIGS. 6A to 6D, hereinbelow is explained a case in which a method in accordance with the third embodiment of the present invention is applied to formation of an n-channel MOS transistor.

Figure 6A:
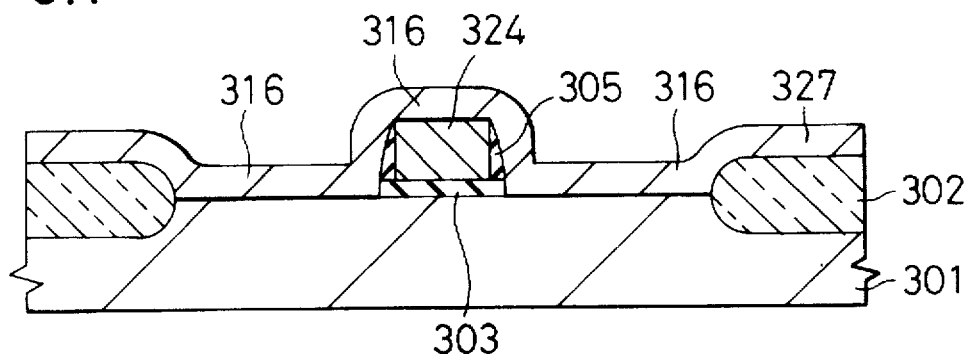
FIGS. 6A, 6B, 6C and 6D are cross-sectional views showing respective step of a method in accordance with the third embodiment of the present invention.

With reference to FIG. 6A, field oxide films 302 are first formed by selective oxidation in device isolation regions on a surface of a p-type silicon substrate 301, and a gate oxide film 303 having a thickness of about 5 nanometers is deposited by thermal oxidation in a region in which a device is to be formed. Then, an N+ or non-doped polysilicon film having a thickness of about 200 nanometers is deposited by CVD entirely over a resultant. Subsequently, the polysilicon film is patterned to thereby form a polysilicon film pattern 324 in a region in which a gate electrode is to be formed. The polysilicon film pattern 324 has a width or gate length of about 0.12 μm on the gate oxide film 303.

Then, a silicon dioxide film (not illustrated) having a thickness of about 20 nanometers is deposited by CVD over a resultant. The thus deposited silicon dioxide film and the gate oxide film 303 are etched back to form a sidewall spacer 305 along a sidewall of the polysilicon film pattern 324. It should be noted that the sidewall spacer 305 may be composed of a silicon nitride film as well as a silicon dioxide film.

A resultant is immersed into dilute hydrofluoric acid to thereby clean an exposed surface of the p-type silicon substrate 301. At this stage, a natural oxidation film 316 still remains deposited on an exposed surface of the p-type silicon substrate 301. Then, sputtering is carried out in argon (Ar) gas to thereby deposit a silicon-rich TiSix film 327 ($x>2$, for instance, $x=4$) having a thickness of about 150 nanometers over a resultant, as illustrated in FIG. 6A.

Figure 6B:
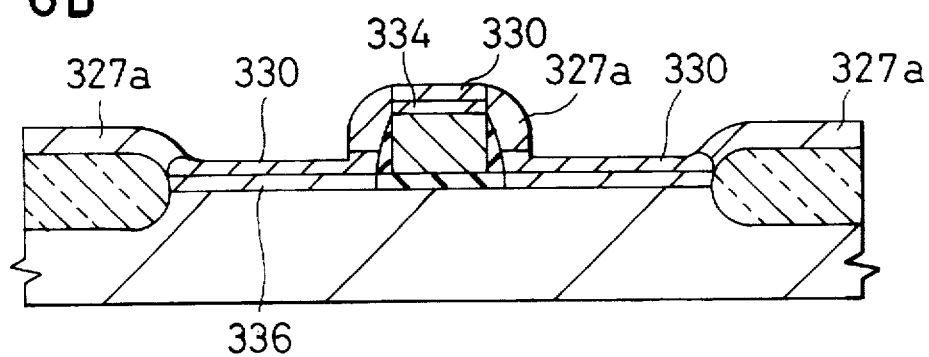

Then, first thermal annealing is carried out at 500° C. for 3 hours, thereby a polysilicon layer 334 having a thickness of about 50 nanometers grows in solid phase on an upper surface of the polysilicon film pattern 324, and the polysilicon layer 334 is covered with a first $TiSi_2$ film 330. On an exposed surface of the p-type silicon substrate 301 is epitaxially grown in solid phase a single crystal silicon layer 336 having a thickness of about 50 nanometers, which is covered with the $TiSi_2$ film 330. A TiSix film 327a remains deposited on the field oxide films 302 and the sidewall spacer 305. On exposed surfaces of the polysilicon film pattern 324 and the p-type silicon substrate 301 is precipitated excessive silicons out of the TiSix film 327a, resulting in that the TiSix film 327a is changed into the $TiSi_2$ film 330, as illustrated in FIG. 6B.

Figure 6C:
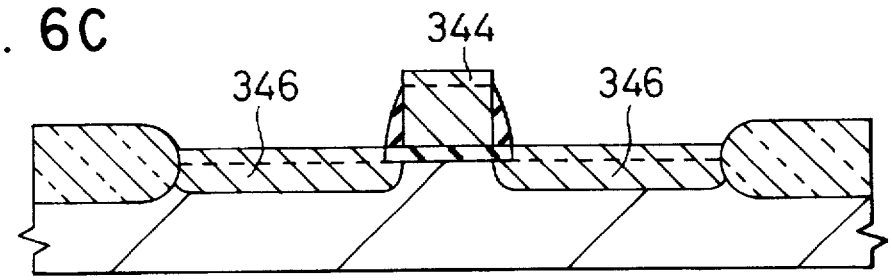

Then, a resultant is immersed in a mixture solution of $H_2O_2$ and $HNO_3$ to thereby selectively etch the TiSix film 327a and the $TiSi_2$ film 330 for removal. Then, ion-implanting is carried out at 30 KeV with doses of $3\times10^{15}$ As $cm^{-2}$ using the field oxide films 302 and the sidewall spacer 305 as a mask, followed by RTA at 1000° C. for 10 seconds. The ion-implanting and subsequent thermal annealing cause the polysilicon layer 334 and single crystal silicon layer 336 to be changed into an N+ polysilicon film pattern 344 and an N+ diffusion layer 346. Though the N+ diffusion layer 346 has equivalently deep junction depth, specifically about 100 nanometers, the effective junction depth is shallow, specifically about 50 nanometers, relative to a surface of the original p-type silicon substrate 301, as illustrated in FIG. 6C.

Then, sputtering is carried out to thereby form a titanium film (not illustrated) having a thickness of about 25 nanometers over a resultant. Subsequently, RTA as second thermal annealing is carried out at 650° C. for 30 seconds to thereby selectively form a C49 structured $TiSi_2$ film (not illustrated) on both an upper surface of the polysilicon film pattern 344 and a surface of the N+ diffusion layer 346. Then, unreacted portions of the titanium film are selectively removed by wet etching.

Then, RTA as third thermal annealing is carried out at 780° C. for 60 seconds to thereby phase-change the C49 structured $TiSi_2$ film formed on both the upper surface of the polysilicon film pattern 344 and the surface of the N+ diffusion layer 346 into C54 structured $TiSi_2$ films 354 and 356, respectively.

Figure 6D:
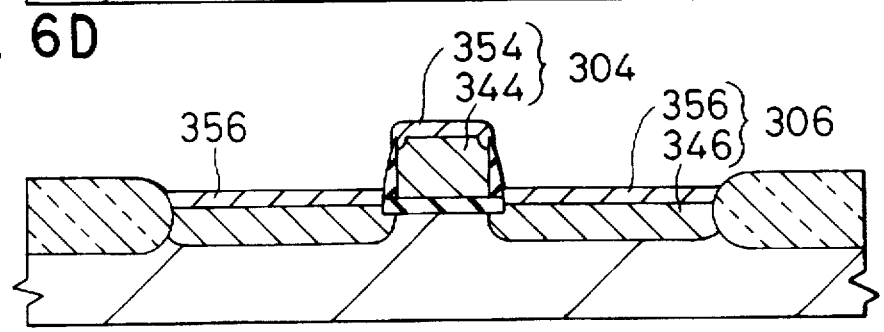

As a result, as illustrated in FIG. 6D, there are completed the formation of both a gate electrode 304 composed of the N+ polysilicon film pattern 344 and the $TiSi_2$ film 354, and a source/drain region 306 composed of the N+ diffusion layer 346 and the $TiSi_2$ film 356.

Subsequently, though not illustrated, formation of interlayer insulative films, formation of contact holes, arrangement of metal wirings and so on are carried out using conventional techniques, thereby an n-channel MOS transistor is completed.

The above mentioned third embodiment can provide the same advantageous effects as those of the first embodiment. Though an N− diffusion layer is not formed in the third embodiment, it is possible to apply the third embodiment to formation of an n-channel MOS transistor having a LDD-structured source/drain diffusion layer.

In the third embodiment, the silicon-rich TiSix film 327 is used as a silicon source for causing the single crystal silicon layer 336 to epitaxially grow in solid phase. However, it should be noted that a silicon-rich refractory metal silicide film composed of titanium and a refractory metal other than titanium may be substituted for the TiSix film 327.

In addition, the third embodiment can be applied to formation of a p-channel MOS transistor and a CMOS transistor, similarly to the first and second embodiments.

In a case where the third embodiment is applied to a method of fabricating a CMOS transistor, a P+ diffusion layer is formed, subsequently to formation of the N+ diffusion layer 346, by carrying out ion-implanting at 10 KeV with doses of $3\times10^{15}$ $BF_2$ $cm^{-2}$, followed by RTA at 650° C. for 30 seconds. The thus formed P+ diffusion layer has equivalent junction depth of about 100 nanometers which is the same as that of the N+ diffusion layer 346.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of fabricating a semiconductor device, comprising the steps of:
    (a) depositing a titanium film over a silicon substrate;
    (b) depositing an amorphous silicon film on said titanium film;
    (c) carrying out first thermal annealing to form a first $TiSi_2$ film over the structure resulting from step (b);
    (d) carrying out second thermal annealing to cause a single crystal silicon layer to grow in a region in which a source/drain region is to be formed;
    (e) successively removing said amorphous silicon film and said first $TiSi_2$ film; and
    (f) forming a highly concentrated diffusion layer in said region, said diffusion layer having conductivity opposite to that of said silicon substrate.

2. The method as set forth in claim 1, wherein a temperature at which said second thermal annealing is to be carried out is higher than a temperature at which said first thermal annealing is to be carried out.

3. A method of fabricating a semiconductor device, comprising the steps of:
    (a) forming a polysilicon film pattern on a silicon substrate in a region A in which a gate electrode is to be formed;
    (b) forming a sidewall spacer along sidewalls of said polysilicon film pattern, said sidewall spacer being composed of insulative material;
    (c) depositing a first titanium film over the structure resulting from step (b);
    (d) depositing an amorphous silicon film on said first titanium film;
    (e) carrying out first thermal annealing to form a first $TiSi_2$ film over the structure resulting from step (d);
    (f) carrying out second thermal annealing to cause a single crystal silicon layer to grow in solid phase in direct contact with a surface of a region B in which a source/drain region is to be formed, and also cause a polysilicon layer to grow in solid phase in direct contact with an exposed surface of said polysilicon film pattern;

(g) successively removing said amorphous silicon film and said first TiSi$_2$ film;

(h) ion-implanting highly concentrated impurities into said region B, said impurities having conductivity opposite to that of said silicon substrate;

(i) depositing a second titanium film over the structure resulting from step (h);

(j) carrying out third thermal annealing to selectively form second TiSi$_2$ films on surfaces of said single crystal silicon layer and said polysilicon layer, said second TiSi$_2$ films having C49 structure; and (k) carrying out fourth thermal annealing to shift said second TiSi$_2$ films in phase from C49 to C54.

4. The method as set forth in claim 3, wherein a temperature at which said second thermal annealing is to be carried out is higher than a temperature at which said first thermal annealing is to be carried out.

5. The method as set forth in claim 4, wherein a temperature at which said third thermal annealing is to be carried out is higher than a temperature at which said second thermal annealing is to be carried out, and a temperature at which said fourth thermal annealing is to be carried out is higher than a temperature at which said third thermal annealing is to be carried out.

6. The method as set forth in claim 3, wherein said second thermal annealing is carried out at a temperature range in which an amorphous silicon film is not changed into a polysilicon film.

7. The method as set forth in claim 3 further comprising the step (l) of forming a refractory metal film between said first titanium film and said amorphous silicon film, said step (l) being to be carried out between said steps (c) and (d).

8. The method as set forth in claim 7, wherein said refractory metal film comprises a metal selected from the group consisting of Co, W and Ni.

9. A method of fabricating a semiconductor device, comprising the steps of:

(a) forming field oxides on a silicon substrate in device isolation regions;

(b) forming a gate oxide film on said silicon substrate in a region A in which a device is to be formed;

(c) forming a polysilicon film pattern on said silicon substrate in a region B in which a gate electrode is to be formed;

(d) depositing an insulative film over the structure resulting from step (c);

(e) anistropically etching said insulative film and said gate oxide film to form a sidewall spacer along sidewalls of said polysilicon film pattern and remove a portion of said gate oxide film disposed in a region C in which a source/drain region is to be formed, said sidewall spacer being composed of said insulative film;

(f) depositing a first titanium film over the structure resulting from step (e); (g) depositing an amorphous silicon film on said first titanium film;

(h) carrying out first thermal annealing to form a first TiSi$_2$ film over the structure resulting from step (g);

(i) carrying out second thermal annealing to cause a single crystal silicon layer to grow in solid phase in direct contact with a surface of said region C, and also cause a polysilicon layer to grow in solid phase in direct contact with an exposed surface of said polysilicon film pattern;

(j) removing said amorphous silicon film and said first TiSi$_2$ film successively;

(k) ion-implanting highly concentrated impurities into said region C using said field oxides and said sidewall spacer as a mask, said impurities having conductivity opposite to that of said silicon substrate;

(l) depositing a second titanium film over the structure resulting from step (k); (m) carrying out third thermal annealing to selectively form second TiSi$_2$ films on surfaces of said single crystal silicon layer and said polysilicon layer, said second TiSi$_2$ films having C49 structure; and (n) carrying out fourth thermal annealing to shift said second TiSi$_2$ films in phase from C49 to C54.

10. The method as set forth in claim 9 further comprising the step of ion-implanting lowly concentrated impurities into said region C using said field oxides and said polysilicon film pattern as a mask, said impurities having conductivity opposite to that of said silicon substrate.

* * * * *